(12) United States Patent
Underhill

(10) Patent No.: US 6,275,101 B1
(45) Date of Patent: Aug. 14, 2001

(54) PHASE NOISE REDUCTION CIRCUITS

(75) Inventor: Michael James Underhill, Lingfield (GB)

(73) Assignee: University of Surrey, Surrey (GB)

( * ) Notice: Subject to any disclaimer, the term of this patent is extended or adjusted under 35 U.S.C. 154(b) by 0 days.

(21) Appl. No.: 09/125,077

(22) PCT Filed: Feb. 14, 1997

(86) PCT No.: PCT/GB97/00405

§ 371 Date: Feb. 19, 1999

§ 102(e) Date: Feb. 19, 1999

(87) PCT Pub. No.: WO97/30516

PCT Pub. Date: Aug. 21, 1997

(30) Foreign Application Priority Data

Feb. 15, 1996 (GB) .................................................. 9603223

(51) Int. Cl.[7] .................................................. H04B 1/10
(52) U.S. Cl. .......................................... 327/551; 327/113
(58) Field of Search .................................. 327/379, 551, 327/122, 113, 124

(56) References Cited

U.S. PATENT DOCUMENTS

| | | |
|---|---|---|
| 4,137,504 | 1/1979 | Simmons . |
| 4,599,579 | * 7/1986 | McCann ................................. 331/1 R |
| 4,602,219 | * 7/1986 | Underhill et al. ........................ 331/16 |
| 4,746,870 | * 5/1988 | Underhill ................................ 328/14 |
| 4,780,888 | 10/1988 | Solhjell et al. . |
| 5,245,557 | 9/1993 | Upton . |

FOREIGN PATENT DOCUMENTS

| | | |
|---|---|---|
| 0089721 | 9/1983 | (EP) . |
| 0229265 | 7/1987 | (EP) . |
| 2578367 | 9/1986 | (FR) . |
| 2117197 | 10/1983 | (GB) . |

OTHER PUBLICATIONS

Japio Abstract of Japanese Patent JP 7264011.
Japio Abstract of Japanese Patent JP. 4048823.
Japio Abstract of Japanese Patent JP 57207419.
Inspec Abstract of Non-Patent Journal "Continuous Phase Shifter for Square Waves" by Rama Murthy, TV in Journal "Electronic Engineering" vol. 51, No. 621, p19, Apr. 1979. UK \* cited by examiner Primary Examiner—Toan Tran
Assistant Examiner—Linh Nguyen
(74) Attorney, Agent, or Firm—Leydig, Voit & Mayer, Ltd.

(57) ABSTRACT

A phase noise reduction circuit for reducing phase noise in an input pulse train consisting of pulses which are all of the same length and which, in the absence of phase noise, have a nominal frequency f, includes a DC removal circuit for removing a DC level from the input pulse train, an integrator for integrating the input pulse train after a DC level has been removed therefrom by the DC removal circuit and a comparator for deriving from the integrated pulse train an output pulse train containing periodic transitions at said nominal frequency. The input pulse train may be derived using a monostable circuit.

24 Claims, 2 Drawing Sheets

PHASE NOISE REDUCTION CIRCUITS

Figure 1:
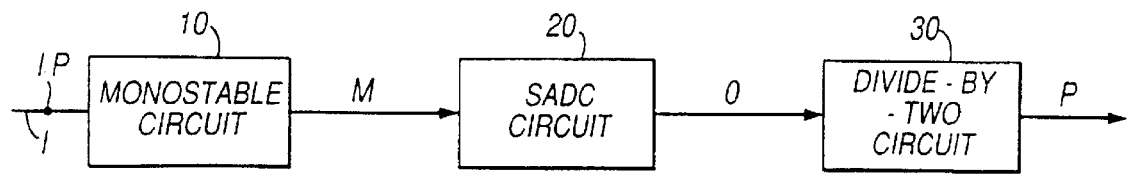

This invention relates to phase noise reduction circuits.

The output from a frequency source, such as an oscillator or a frequency synthesiser will always contain phase noise which may be in the form of broadband noise or discrete component noise. Phase noise is undesirable in that it may ultimately limit the performance of any system (e.g. a communications or radar system) containing the frequency source. Accordingly, a low phase noise frequency source will frequently incorporate some form of compensation circuit which is designed to limit the extent of any phase noise that may be produced. However, a compensation circuit has the disadvantage that it adds to the overall complexity and expense of the frequency source.

By way of illustration, EP-A-0089721 describes a variable frequency synthesiser including a phase lock loop and a compensation circuit which is connected to the loop to reduce phase jitter therein. The compensation circuit includes an integrator and a phase modulator. The output from the integrator represents the amount of phase noise in the phase lock loop, and this output is used to control the phase modulator. The phase modulator responds to the integrator output by adjusting the relative phases of reference pulses supplied to the phase lock loop to reduce the amount of phase noise present.

According to a first aspect of the invention there is provided a phase noise reduction circuit for reducing phase noise in an input pulse train consisting of pulses which are all of the same length and which, in the absence of phase noise, have a nominal frequency f, the phase noise reduction circuit including DC removal means for removing a DC level from the input pulse train, integrator means for integrating the input pulse train after a DC level has been removed therefrom by the DC removal means, and processing means for deriving from the integrated pulse train an output pulse train containing periodic transitions at said nominal frequency.

According to a second aspect of the invention there is provided a phase noise reduction circuit for reducing phase noise contained in an input pulse train produced by a frequency source, which pulse train, in the absence of any phase noise, has a nominal frequency f, the phase noise reduction circuit comprising, pulse generating means for deriving a modified pulse train from the Input pulse train, the modified pulse train consisting of pulses which all of the same length and are all triggered by the positive-going (or alternatively the negative-going) transitions of the pulses forming the input pulse train, and compensation means including, DC removal means for removing a DC level from the modified pulse train, integration means for integrating the modified pulse train after a DC level has been removed therefrom by the DC removal means and processing means for deriving from the integrated pulse train an output pulse train containing periodic transitions at said nominal frequency.

According to a third aspect of the invention there is provided a phase noise reduction circuit for reducing phase noise contained in an input pulse train produced by a frequency source, which pulse train in the absence of any phase noise has a nominal frequency, f, the phase noise reduction circuit comprising a first pulse generating means for deriving a first modified pulse train from the input pulse train, the first modified pulse train consisting of pulses which are all of the same length and are triggered by the positive-going transitions of the pulses forming the input pulse train, a second pulse generating means for deriving a second modified pulse train from the input pulse train, the second modified pulse train consisting of pulses which are all of the same length and are triggered by the negative-going transitions of the pulses forming the input pulse train, first compensation means including first DC removal means for removing a DC level from the first modified pulse train, first integrator means for integrating the first modified pulse train after a DC level has been removed therefrom by the first DC removal means and first processing means for deriving from the integrated pulse train output by the first integrator means a first output pulse train containing transitions which are periodic and have the frequency, second compensation means including second DC removal means for removing a DC level from the second modified pulse train, second integrator means for integrating the second modified pulse train after a DC level has been removed therefrom by the second DC removal means and second processing means for deriving from the integrated pulse train output by the second integrator means a second output pulse train also containing transitions which are periodic and have the frequency, first and second output circuits for extracting from the first and second pulse trains respectively first and second periodic pulse trains respectively, and combining means for combining the first and second periodic pulse trains to produce a combined output pulse train at said nominal frequency f.

It will be appreciated that phase noise reduction circuits according to the invention have the capability to operate on the pulse train produced at the output of a frequency source, and need not form a part of the frequency source itself.

Figure 2A:
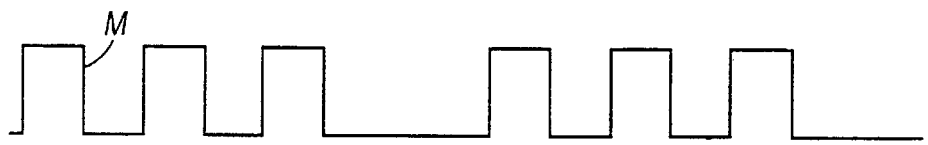
Figure 2B:
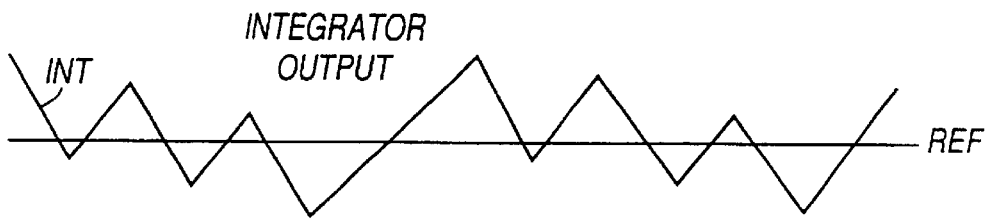
Figure 2C:
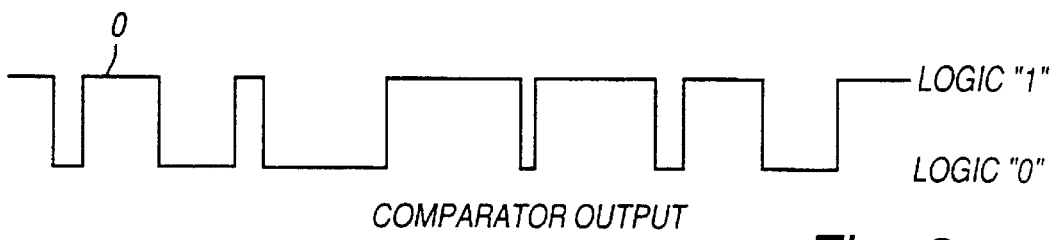
Figure 2D:
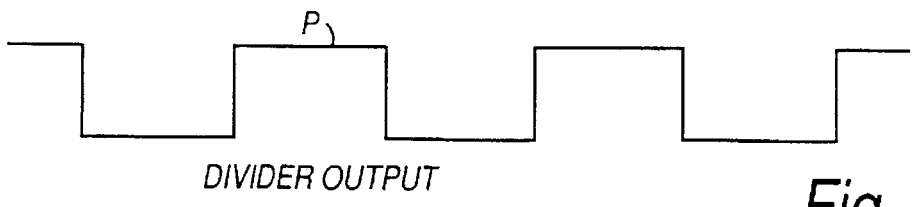
Figure 3:
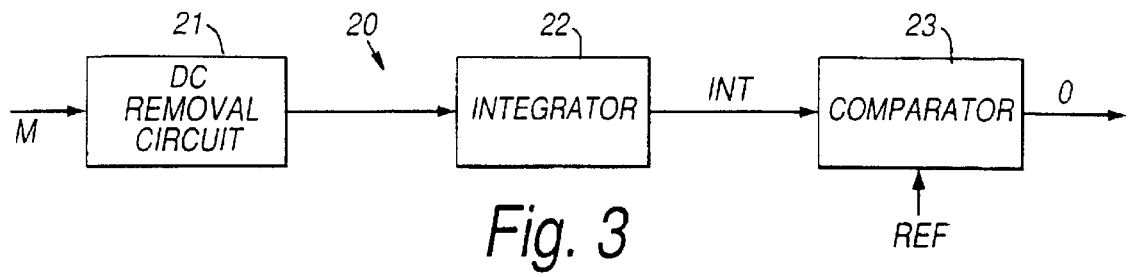
Figure 4:
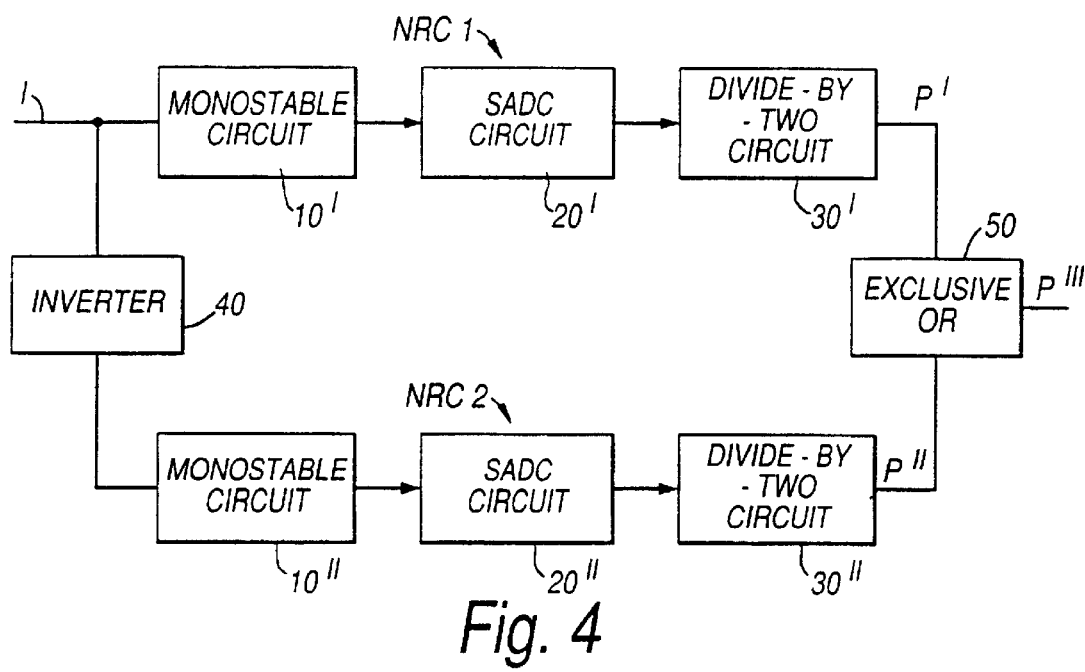
Figure 5:
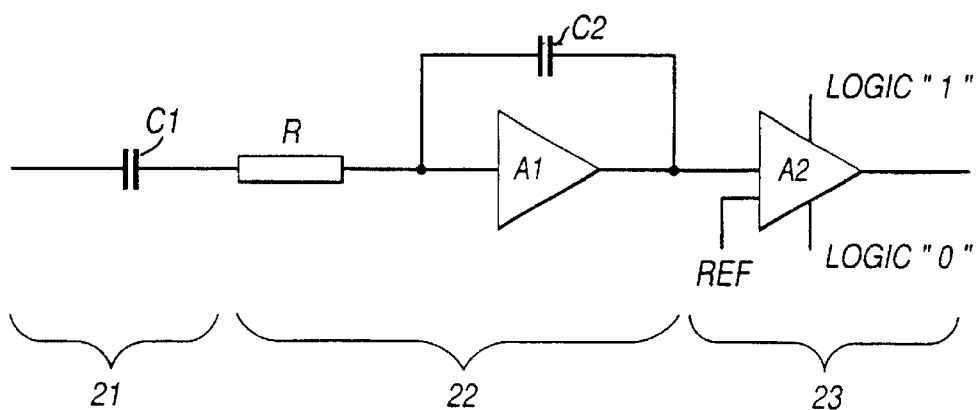

Embodiments of the invention are now described, by way of example only, with reference to the accompanying drawings of which, FIG. 1 shows a first phase noise reduction circuit according to the invention, FIGS. 2(a) to 2(d) illustrate different waveforms useful in understanding the operation of the phase noise reduction circuit of FIG. 1, FIG. 3 shows a SADC circuit forming part of the phase noise reduction circuit of FIG. 1, FIG. 4 shows a second phase noise reduction circuit according to the invention, and FIG. 5 shows a specific implementation of the SADC circuit of FIG. 3.

Referring now to FIG. 1, the phase noise reduction circuit comprises the serial arrangement of a monostable circuit 10, a self-adjusting delay compensation (SADC) circuit 20 and a divide-by-two circuit 30.

An input pulse train I is supplied to the monostable circuit 10 via an input I/P to the phase noise reduction circuit. The input pulse train I, which may be generated by any suitable frequency source, such as an oscillator or a frequency synthesiser, has an ideal or nominal pulse repetition frequency f, but may also be subject to phase noise e.g. time jitter. The phase noise reduction circuit is designed to reduce or eliminate such phase noise.

In this embodiment, the monostable circuit 10 is triggered by the positive-going transitions in the input pulse train I (although the negative-going transitions could alternatively be used) and, in response, generates at its output a modified pulse train M consisting of pulses which all have the same, fixed length. For optimum operation of the phase noise reduction circuit, the pulses generated by the monostable circuit 10 should be shorter than the shortest pulse spacing or period in the input pulse train I, corresponding to the highest attainable input pulse repetition frequency f. In practice, the sum of the chosen pulse length and the recovery time of the monostable circuit should be less than the shortest pulse spacing in the input pulse train I.

FIG. 2(a) shows a short sequence from a modified pulse train M output by the monostable circuit 10, and demonstrates the effect of phase noise. It will be observed that the fourth pulse in the sequence is missing, resulting in an average pulse repetition frequency, $f_a$ which is only ¾ of the nominal pulse repetition frequency f. The missing pulse is attributable to phase noise in the input pulse I and can be interpreted as a negative jump in phase by 2π in the input pulse train or a negative frequency impulse or a negative time jitter step of duration T (='/f), corresponding to one complete cycle in the nominal pulse repetition frequency.

The modified pulse train M is supplied to the SADC circuit 20 which, as shown in FIG. 3, comprises the serial arrangement of a DC removal circuit 21, an integrator 22 and a comparator 23.

Initially, the DC removal circuit 21 removes any DC component from the modified pulse train M. The resultant pulse train is then integrated by the integrator 22 and the integrator output INT is supplied to the comparator 23 where it is compared with a reference level REF. FIG. 2(b) shows the integrator output INT derived from the modified pulse train M of FIG. 2(a), and FIG. 2(b) also shows the reference level REF with which the magnitude of the integrator output INT is compared.

The comparator 23 has a binary output and is arranged to switch this output from one binary state (logic "1", say) to the opposite binary state (logic "0", say) whenever the magnitude of the integrator output INT crosses the reference level REF. In this manner, the comparator 23 generates an output pulse train O. FIG. 2(c) illustrates the form of the output pulse train O generated by comparator 23 in response to the integrator output of FIG. 2(b), and it will be observed from FIG. 2(c) that each transition in the output pulse train O is coincident with a respective point of intersection of the integrator output INT and the reference level REF. The integrator output INT represents the variation of phase across the modified pulse train M, and the effect of the comparator 23 is automatically to adjust the timing of the transitions in the output pulse train O so that they all occur at the same relative phase, determined by the reference level REF. In consequence of this, the SADC circuit 20 is effective to compensate for phase noise present in the input pulse train I; however, because the pulses which form the modified pulse train M (from which the integrator output INT is derived) are all triggered by (in this embodiment) the positive-going transitions in the input pulse train I, circuit 20 is only capable of compensating for phase noise affecting the positive going transitions—in this embodiment, circuit 20 does not compensate for phase-noise affecting negative-going transitions. With this in mind, it will be seen that the (noise-compensated) positive-going pulses in the output pulse train O of FIG. 2(c) are periodic, occurring at the nominal pulse repetition frequency, f.

The periodic, positive-going transitions correspond to the positive-going transitions in the input impulse train I after the affect of phase noise has been eliminated, and FIG. 2(d) shows the corresponding noise-compensated, output pulse train P which is derived from the periodic, positive-going transitions by passing the output pulse train O of FIG. 2(c) through the divide-by-two circuit 30 shown in FIG. 1.

Although the SADC circuit 20 can only be used to compensate for phase noise affecting one type of transition in the input pulse train I (i.e. either positive-going transitions or negative-going transitions), it is nevertheless possible to derive a noise-compensated output pulse train having the nominal pulse repetition frequency f by passing the pulse train P (FIG. 2(d)) through a frequency doubler.

In an alternative approach, two identical noise reduction circuits, each being of the form described with reference to FIGS. 1 to 3 may be used, and an arrangement of this kind is shown in FIG. 4.

Referring to FIG. 4, a first phase noise reduction circuit (NRC1) comprises the serial arrangement of a first monostable circuit 10', a first SADC circuit 20', and a first divide-by-two circuit 30'; and a second phase noise reduction unit (NRC2) comprises the serial arrangement of a second monostable circuit 10", a second SADC circuit 20" and a second divide-by-two circuit 30". The first and second phase noise reduction circuits NRC1 and NRC2 are connected together in parallel, and the input pulse train I (having the nominal pulse repetition frequency f) is supplied directly to the first monostable circuit 10' and is supplied via an inverter 40 to the second monostable circuit 10".

As in the case of the embodiment described with reference to FIGS. 1 to 3, the first monostable circuit 10' is triggered by positive going transitions in the input pulse train I. Therefore, the first phase noise reduction circuit (NRC1) is effective to compensate for phase noise affecting only the positive going transitions in the input pulse train I, and generates at its output a first periodic output pulse train P' of the form shown in FIG. 2(d) having half the nominal pulse repetition frequency, ½f.

The second monostable circuit 10" is also triggered by positive-going transitions. However, because these transitions are received via the inverter 40, the second phase noise reduction circuit NRC2 is effective to compensate for phase noise affecting only the negative-going transitions in the input pulse train I. Thus, the second phase noise reduction circuit NRC2 generates at its output a second periodic output pulse train P" which is again of the form shown in FIG. 2(d) but which is in phase quadrature with the first pulse train P' generated at the output of the first phase noise reduction circuit NRC1. These two pulse trains P', P" are combined by means of an exclusive OR device 50 to produce a phase-compensated output pulse train P'" having the nominal pulse repetition frequency f corresponding to the input pulse train I.

FIG. 5 shows a typical implementation of the SADC circuit shown in FIG. 3. In this implementation, the DC removal circuit 21 comprises a capacitor C1, the integrator 22 comprises the combination of a resistor R, an operational amplifier A1 and a second capacitor C2, and the comparator 23 comprises a second operational amplifier A2 having a reference input for the reference level REF.

In practice, additional circuitry may be provided to prevent or reduce integrator drift; for example, this may be achieved by providing a small amount of resistive DC feedback between the output from and the input to the first operational amplifier A1, the amount of feedback used being insufficient to affect substantially the DC frequency response of the integrator 22.

In a modification of the embodiments described with reference to FIGS. 1 to 5, a feedforward signal is derived from a DC component produced at the output of the or each monostable circuit 10; 10', 10". The feedforward signal is used to offset or substantially cancel a step change in DC level occurring at the input to the or each SADC circuit 20; 20', 20" whenever the nominal pulse repetition frequency f is stepped to a new frequency, the size of the step change in DC level being dependent on the size of the frequency change. A similar offset may alternatively or additionally be achieved by means of a feedback signal derived from a DC component in the or each integrator output, If such measures are not adopted the or each SADC circuit may require an undesirably long settling time following a large frequency step change.

An alternative modification is to use the feedforward signal to preset to a constant value the mark space ratios of the wavebands appearing at the output of the respective monostables. This has the effect of cancelling or minimising the shift in DC level to the DC removal circuit when a (large) frequency step is commanded.

In a further embodiment of the invention, two or more phase noise reduction circuits of the kind described with reference to FIGS. 1 to 5 may be connected together serially to form a cascaded arrangement. This enables phase noise reduction to be carried out progressively, in stages, allowing the practical design tolerance in each stage to be relaxed.

It will be appreciated that the described phase noise reduction circuits have the capability to operate on the pulse train produced at the output from a frequency source, and need not form part of the frequency source itself. A further advantage of the described circuits is that they consume relatively little power, thereby extending the potential applications of the circuits.

What is claimed is:

1. A phase noise reduction circuit for reducing phase noise in an input pulse train consisting of pulses which are all of the same length and which, in the absence of phase noise, have a nominal frequency f, the phase noise reduction circuit including DC removal means for removing a DC level from the input pulse train, integrator means for integrating the input pulse train after a DC level has been removed therefrom by the DC removal means to produce an integrated pulse train having a sawtooth waveform, and a comparison circuit for comparing the integrated pulse train with a reference level to produce an output pulse train containing periodic transitions at said nominal frequency f.

2. A phase noise reduction circuit as claimed in claim 1 wherein the comparison circuit generates a binary output and is arranged to switch the output from one binary state to the opposite binary state whenever the integrated pulse train crosses the reference level.

3. A phase noise reduction circuit as claimed in claim 1 further including an output circuit for extracting from said output pulse train a periodic output pulse train at half said nominal frequency, ½f.

4. A phase noise reduction circuit as claimed in claim 3 wherein said output circuit comprises a divide-by-two circuit.

5. A phase noise reduction circuit as claimed in claim 3 including a frequency doubler for converting said periodic output pulse train at said frequency ½f, to a periodic output pulse train at said nominal frequency f.

6. A phase noise reduction circuit for reducing phase noise contained in an input pulse train produced by a frequency source, which pulse train, in the absence of any phase noise, has a nominal frequency f, the phase noise reduction circuit comprising, pulse generating means for deriving a modified pulse train from the input pulse train, the modified pulse train consisting of pulses which are all of the same length and are all triggered by the positive-going (or alternatively the negative-going) transitions of the pulses forming the input pulse train, and compensation means including DC removal means for removing a DC level from the modified pulse train, integrator means for integrating the modified pulse train after a DC level has been removed therefrom by the DC removal means to produce an integrated pulse train having a sawtooth waveform and a comparison circuit for comparing the integrated pulse train with a reference level to produce an output pulse train containing periodic transitions at said nominal frequency f.

7. A phase noise reduction circuit as claimed in claim 6 wherein said pulse generating means comprises a monostable circuit which is triggered by said positive-going (or alternatively negative-going) transitions of the input pulse train.

8. A phase noise reduction circuit as claimed in claim 7 wherein the monostable circuit has an adjustable delay and produces pulses of preset length.

9. A phase noise reduction circuit as claimed in claim 6 wherein the comparison circuit generates a binary output as is arranged to switch the output from one binary state to the opposite binary state whenever the integrated pulse train crosses the reference level.

10. A phase noise reduction circuit as claimed in claim 6 including an output circuit for extracting from said output pulse train a periodic output pulse train at half said nominal frequency ½f.

11. A phase noise reduction circuit as claimed in claim 10 wherein the output circuit comprises a divide-by-two circuit.

12. A phase noise reduction circuit as claimed in claim 10 including a frequency doubler for converting the periodic output pulse train at said frequency ½f to a periodic output pulse train at said nominal frequency, f.

13. A phase noise reduction circuit for reducing phase noise contained in an input pulse train produced by a frequency source, which pulse train in the absence of any phase noise has a nominal frequency, f, the phase noise reduction circuit comprising a first pulse generating means for deriving a first modified pulse train from the input pulse train, the first modified pulse train consisting of pulses which are all of the same length and are triggered by the positive-going transitions of the pulses forming the input pulse train, a second pulse generating means for deriving a second modified pulse train from the input pulse train, the second modified pulse train consisting of pulses which are all of the same length and are triggered by the negative-going transitions of the pulses forming the input pulse train, first compensation means including first DC removal means for removing a DC level from the first modified pulse train, first integrator means for integrating the first modified pulse train after a DC level has been removed therefrom by the first DC removal means to produce a first integrated pulse train having a sawtooth waveform and a first comparison circuit for comparing the first integrated pulse train with a reference level to produce a first output pulse train containing periodic transitions at said nominal frequency f, second compensation means including second DC removal means for removing a DC level from the second modified pulse train, second integrator means for integrating the second modified pulse train after a DC level has been removed therefrom by the second DC removal means to produce a second integrated pulse train having a sawtooth waveform and a second comparison circuit for comparing the second integrated pulse train with a reference level to produce a second output pulse train also containing periodic transitions at said nominal frequency f, first and second output circuits for extracting from the first and second output pulse trains respectively first and second periodic pulse trains respectively, and combining means for combining the first and second periodic pulse trains to produce a combined output pulse train at said nominal frequency f.

14. A phase noise reduction circuit as claimed in claim 13 wherein said first and second pulse generating means are both monostable circuits, and the input pulse train is supplied to one or the other of the monostable circuits via an inverting circuit.

15. A phase noise reduction circuit as claimed in claim 14 wherein the monostable circuits have adjustable delays and produce pulses of preset length.

16. A phase noise reduction circuit as claimed in claim 13 wherein the first comparison circuit generates a first binary output and is arranged to switch the first binary output from one binary state to the opposite binary state whenever the first integrated pulse train output by said first integrator means crosses the reference level, and the second comparison circuit generates a second binary output and is arranged to switch the second binary output from one binary state to the opposite binary state whenever the second integrated pulse train output by the second integrator means crosses the reference level.

17. A phase noise reduction circuit as claimed in claim 13 wherein the combining means is an exclusive OR device.

18. A phase noise reduction circuit as claimed in claim 13 wherein said first and second DC removal means are responsive to a DC component produced at the output of at least one of the first and second pulse generating means whereby to reduce the effect of a step change in DC level which occurs when the nominal frequency f of the input pulse train is changed.

19. A phase noise reduction circuit as claimed in claim 13 wherein said first and second DC removal means are responsive to feedback signals from the first and second integrator means respectively whereby to reduce the effect of a step change in DC level which occurs when the nominal frequency f of the input pulse train is changed.

20. A phase noise reduction circuit as claimed in claim 8 wherein said preset length is switched to maintain a substantially constant mark space ratio as the frequency is changed.

21. A cascaded plurality of phase noise reduction circuits as claimed in claim 13.

22. A phase noise reduction circuit as claimed in claim 15 wherein said preset length is switched to maintain a substantially constant mark space ratio as the frequency is changed.

23. A cascaded plurality of phase noise reduction circuits, wherein each said phase noise reduction circuit is for reducing phase noise in an input pulse train consisting of pulses which are all of the same length and which, in the absence of phase noise, have a nominal frequency f, and each said phase noise reduction circuit includes DC removal means for removing a DC level from the input pulse train, integrator means for integrating the input pulse train after a DC level has been removed therefrom by the DC removal means to produce an integrated pulse train having a sawtooth waveform, and a comparison circuit for comparing the integrated pulse train with a reference level to produce an output pulse train containing periodic transitions at said nominal frequency f.

24. A cascaded plurality of phase noise reduction circuits, wherein each said phase noise reduction circuit is for reducing phase noise contained in an input pulse train which, in the absence of any phase noise, has a nominal frequency f, and each said phase noise reduction circuit includes pulse generating means for deriving a modified pulse train from the input pulse train, the modified pulse train consisting of pulses which are all of the same length and are all triggered by the positive-going (or alternatively the negative-going) transitions of the pulses forming the input pulse train, and compensation means including DC removal means for removing a DC level from the modified pulse train, integrator means for integrating the modified pulse train after a DC level has been removed therefrom by the DC removal means to produce an integrated pulse train having a sawtooth waveform and a comparison circuit for comparing the integrated pulse train with a reference level to produce an output pulse train containing periodic transitions at said nominal frequency f.

* * * * *